United States Patent
Chen

(10) Patent No.: US 7,271,417 B2
(45) Date of Patent: Sep. 18, 2007

(54) LIGHT-EMITTING ELEMENT WITH POROUS LIGHT-EMITTING LAYERS

(75) Inventor: Cheng Chuan Chen, Tainan County (TW)

(73) Assignee: Genesis Photonics (TW)

( * ) Notice: Subject to any disclaimer, the term of this patent is extended or adjusted under 35 U.S.C. 154(b) by 261 days.

(21) Appl. No.: 11/135,639

(22) Filed: May 24, 2005

(65) Prior Publication Data

US 2006/0081832 A1    Apr. 20, 2006

(30) Foreign Application Priority Data

Oct. 20, 2004    (TW) .............................. 93131856 A

(51) Int. Cl.
*H01L 27/01* (2006.01)
*H01L 27/125* (2006.01)

(52) U.S. Cl. ............................ 257/79; 257/86; 257/94; 257/103; 438/22

(58) Field of Classification Search ................. 257/79, 257/86, 94, 103; 438/22
See application file for complete search history.

(56) References Cited

U.S. PATENT DOCUMENTS

| | | | | |
|---|---|---|---|---|
| 5,939,732 A * | 8/1999 | Kurtz et al. | .................. | 257/77 |
| 6,376,864 B1 * | 4/2002 | Wang | .......................... | 257/98 |
| 6,562,646 B2 * | 5/2003 | Watanabe et al. | ............. | 438/31 |

FOREIGN PATENT DOCUMENTS

JP    11-354839    12/1999

* cited by examiner

*Primary Examiner*—Wai-Sing Louie
*Assistant Examiner*—Marc-Anthony Armand
(74) *Attorney, Agent, or Firm*—Banner & Witcoff, Ltd.

(57) ABSTRACT

The invention relates to a light-emitting element with porous light-emitting layers. The light-emitting element comprises: a substrate, a first conductive cladding layer, a second conductive cladding layer and at least one porous light-emitting layer. The porous light-emitting layer is formed between the first conductive cladding layer and the second conductive cladding layer, and has an upper barrier layer, a lower barrier layer and a carrier trap layer. The carrier trap layer positioned between the upper barrier layer and the lower barrier layer has a plurality of chevron structures for defining a plurality of valley shaped structures, and is an indium-containing nitride structure, the energy band gap of which is less than those of the upper barrier layer and the lower barrier layer. By utilizing the light-emitting element of the invention, the driving voltage of the element can be decreased significantly; thereby a preferred crystalline structure can be obtained so that the anti-static electricity ability and element reliability could be improved. Moreover, a plurality of porous light-emitting layers with different wavelengths may be grown on the light-emitting element of the invention, so as to elevate the performance of the light-emitting element effectively, and also to achieve a light-mixing element of a single chip, meanwhile so as to obtain the properties of high light-emitting benefit, high reliability, high light-mixing modularity and low cost and the like.

16 Claims, 9 Drawing Sheets

LIGHT-EMITTING ELEMENT WITH POROUS LIGHT-EMITTING LAYERS

BACKGROUND OF THE INVENTION

1. Field of the Invention

The invention relates to a light-emitting element, specifically, a light-emitting element with porous light-emitting layers.

2. Description of the Related Art

In recent years, as the price of a light-emitting diode becomes cheaper and cheaper, various application products utilizing the properties of the light-emitting diode such as thin, light, short and small, power-saving, and multi-colorizing, become more and more popular, such as in various assistant back lights for electronic instrument decoration, automobile instrument panels, public decorative lamps, various indoor indicator lights, fascia advertisement lamp and the like. Looking into the future, it is not a dream that all of the existing light-emitting elements will be substituted by solid light-emitting diodes.

Reviewing the development history of the light-emitting diode, the earliest light-emitting layer structure is a simple P and N junction, but the efficiency is poor since the chance for an electron and a hole to recombine is not so high. Since it has been known how to utilize quantum engineering or Energy band Gap engineering to make a light-emitting structure with a quantum well structure having a heterogeneous interface, the light-emitting efficiency of a light-emitting diode is thus improved greatly.

With reference to FIG. 1, a conventional quantum well light-emitting layer 10 has a quantum well structure 12, a first barrier layer 11 and a second barrier layer (not shown). The first barrier layer 11 is located below the quantum well structure 12, and the second barrier layer is located above the quantum well structure 12. In order to utilize a low energy band gap material (the quantum well structure 12) grown within a limited thickness, the quantum well light-emitting layer 10 comprises in the upper and lower layers having higher energy band gap materials (the first barrier layer 11 and the second barrier layer). In the view of the energy band gap, this structure may provide a carrier trap in one-dimensional space, so the carrier can be effectively trapped within the quantum well structure having the low energy band gap.

However, the disadvantage is that although most of the carriers can be captured and hence trapped in this quantum well without escaping, this carrier still has the ability to move in two-dimensional space, therefore resulting in the performance of the quantum well to be limited, including the disadvantages that the driving voltage cannot be further decreased, the anti-static electricity ability cannot be elevated effectively, and the light-emitting efficiency may be limited by the limited carrier recombination efficiency of the quantum well. Moreover, although the light-emitting diode has become a widely available commercial product to date, the light-emitting diode found in the market is still limited to the property of single chip and single wavelength.

Therefore, there is a necessity to provide an innovated and progressive light-emitting element to solve the problems described above.

SUMMARY OF THE INVENTION

The object of the invention is to provide a light-emitting element with porous light-emitting layers. The light-emitting element comprises: a substrate, a first conductive cladding layer, a second conductive cladding layer and at least one porous light-emitting layer. The porous light-emitting layer is formed between the first conductive cladding layer and the second conductive cladding layer, and has an upper barrier layer, a lower barrier layer and a carrier trap layer. The carrier trap layer which is positioned between the upper barrier layer and the lower barrier layer has a plurality of chevron structures for defining a plurality of valley shaped structures, and it is an indium-containing nitride structure, the energy band gap of which is less than that of the upper barrier layer and the lower barrier layer.

By utilizing the light-emitting element of the invention, the driving voltage of the element can be decreased significantly, and so this light-emitting structure can be used to reduce the doping concentration in the light-emitting layer without affecting the driving voltage, thereby a preferred crystalline structure can obtained so that the anti-static electricity ability and element reliability can be improved.

Moreover, a plurality of porous light-emitting layers with different wavelengths may be grown on the light-emitting element of the invention, so as to elevate the performance of the light-emitting element effectively, and also to achieve a light-mixing element of a single chip, with the properties of high light-emitting benefit, high reliability, high light-mixing modularity and low cost and the like. Also, the porous light-emitting layer structure of the invention can overcome the shortage that a light-emitting element in the prior art can only emit a single wavelength. The light-emitting element of the invention can achieve the combination of the light-emitting layers with different light-emitting frequency spectrums to produce an efficient element with a high flexible light-mixing ratio.

DETAILED DESCRIPTION OF THE INVENTION

It has been found in the research that the PN junction characteristic cannot be further improved by using a conventional quantum well planar structure. Accordingly, the present invention develops a light-emitting layer with a porous structure to improve the characteristic of a light-emitting diode. It is intended to alter the light-emitting element to a structure with porous light-emitting layers by creating a quantum well light-emitting layer with a different structure from the traditional planar continuous structure, so as to improve the properties of the light-emitting element.

Figure 1:
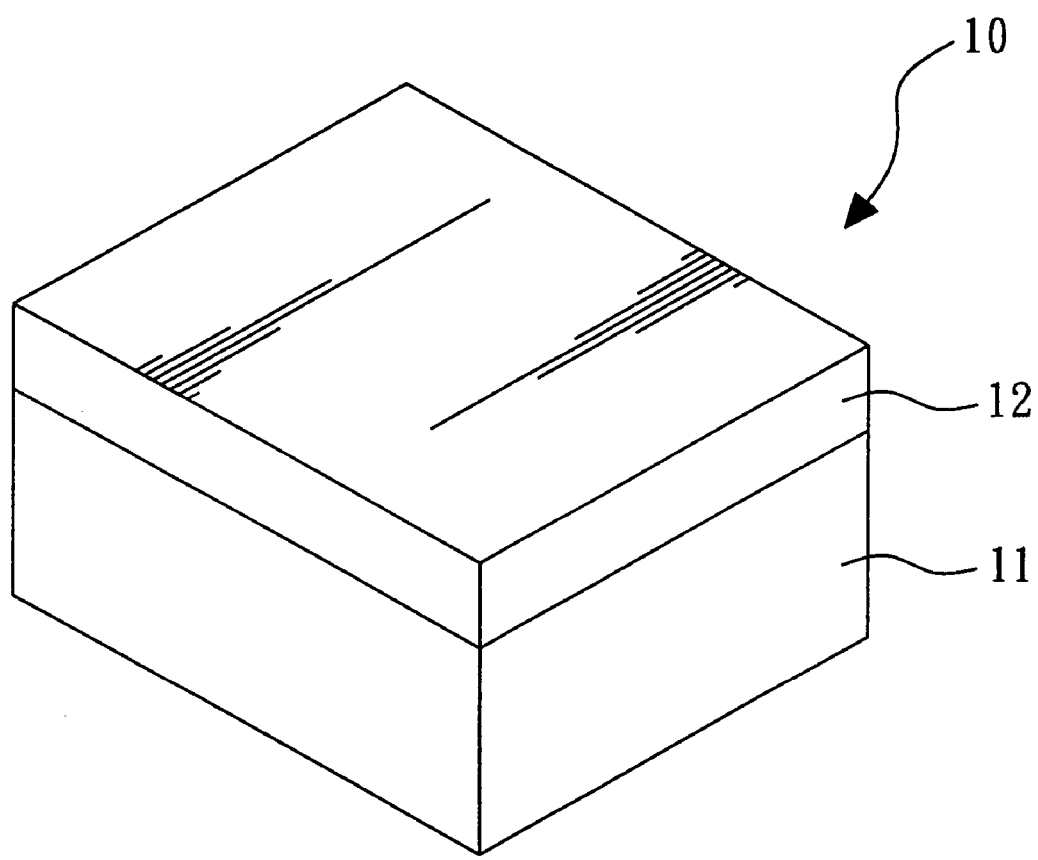
FIG. 1 is a schematic view of the structure of a conventional quantum-well light-emitting layer.
Figure 2:
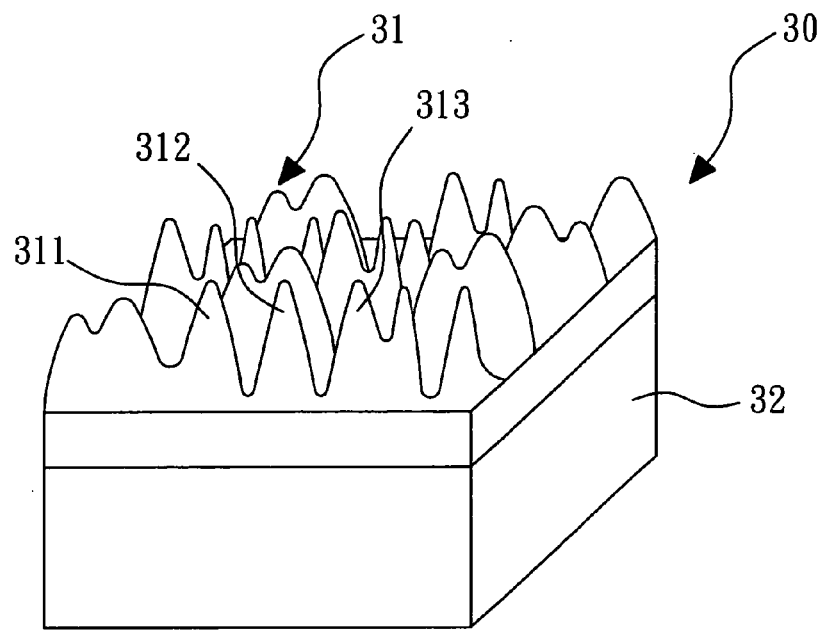
FIG. 2 is a perspective view of the structure of a porous light-emitting layer of the invention.
Figure 3:
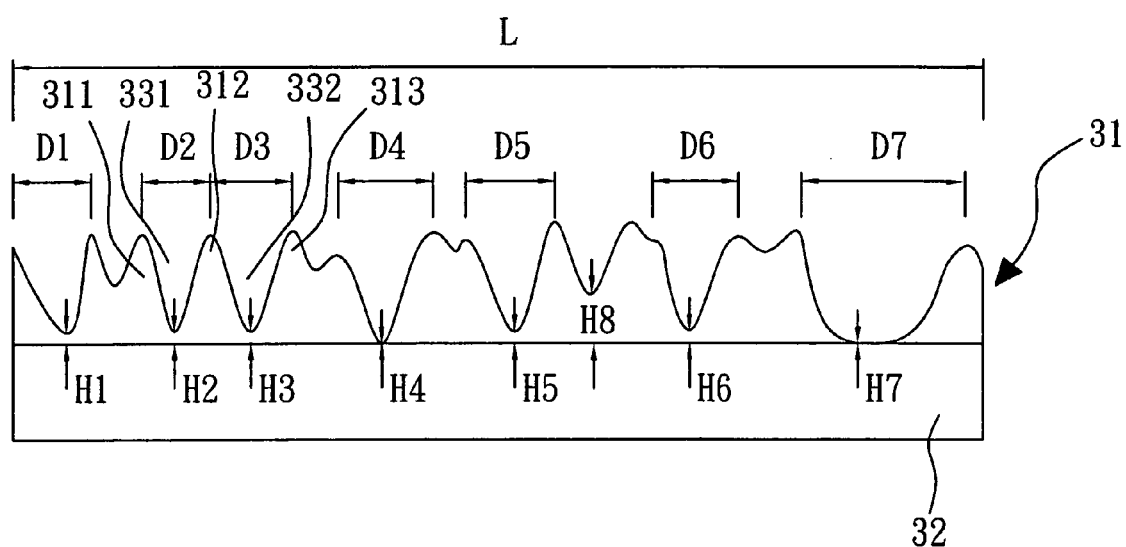
FIG. 3 is a cross-sectional view of the structure of a porous light-emitting layer of the invention.

With reference to FIG. 2 and FIG. 3, a porous light-emitting layer structure 30 includes a carrier trap layer 31, a lower barrier layer 32 and an upper barrier layer (not shown). The lower barrier layer 32 is located below the carrier trap layer 31, and the upper barrier layer is located above the carrier trap layer 31. The lower barrier layer 32 is a material having the higher energy band gap, such as gallium nitride (GaN), and the carrier trap layer 31 grown on the lower barrier layer 32 is a material having the lower energy band gap (lower than the energy band gap of the lower barrier layer 32), such as indium gallium nitride (InGaN). By controlling the growing temperature, gas fractional pressure and the like, the carrier trap layer 31 is provided with a plurality of chevron structures 311, 312, 313, etc., for defining a plurality of valley shaped structures 331, 332, etc. For example, the valley shaped structure 331 is located between at least two chevron structures 311, 312. The shapes of the valley shaped structures 331, 332 are porous structures. After forming the porous configurations of the plurality of the valley shaped structures of the carrier trap layer 31, the upper barrier layer which is a material having the higher energy band gap (higher than the energy band gap of the carrier trap layer 31) such as gallium nitride (GaN), is further grown to clad the carrier trap layer 31.

With reference to FIG. 3, it shows the schematically cross-sectional view of a porous light-emitting layer 30 of the present invention. The distance between the bottom of the valley shaped structures of the present invention and the lower barrier layer 32 must be in the range of no less than zero to no more than $20 \times 10^{-10}$ meters, i.e. H1, H2, H3, H4, H5, H6, H7 as shown in FIG. 3 must be less than $20 \times 10^{-10}$ meters, and then the concave structure is just the valley-shaped structure of the present invention. If the distance between the bottom of the concave structure and the lower barrier layer 32 is greater than $20 \times 10^{-10}$ meters, for example, H8 in FIG. 3, the concave structure is not the valley-shaped structure of the present invention. In terms of the above limitation, after the valley-shaped structures are determined, the radial length for each of the valley-shaped structures in a direction is generally between $10 \times 10^{-9}$ and $1000 \times 10^{-9}$ meters, for example, D1, D2, D3, D4, D5, D6, D7, etc. as shown in FIG. 3, i.e., the radial length for each of the valley shaped structures.

Preferably, the density of the porous light-emitting layer 30 of the present invention is between 5% and 75%, which is the ratio of the sum of the radial length of the all valley-shaped structures to the radial length of the porous light-emitting layer. For example, in FIG. 3, the sum of the radial length of the all valley-shaped structures is the sum of D1+D2+D3+D4+D5+D6+D7, and the radial length of the porous light-emitting layer is L. Thus, the density of the porous light-emitting layer is (D1+D2+D3+D4+D5+D6+D7)/L.

The light-emitting elements will be illustrated below as the embodiments of the present invention with reference to the accompanying drawings. In the drawings, the same or similar parts correspond to the same or similar element symbols and names. In addition, the drawings are merely schematic, and the scale of structures in the drawings might be different from the scale of the actual structures.

Figure 4:
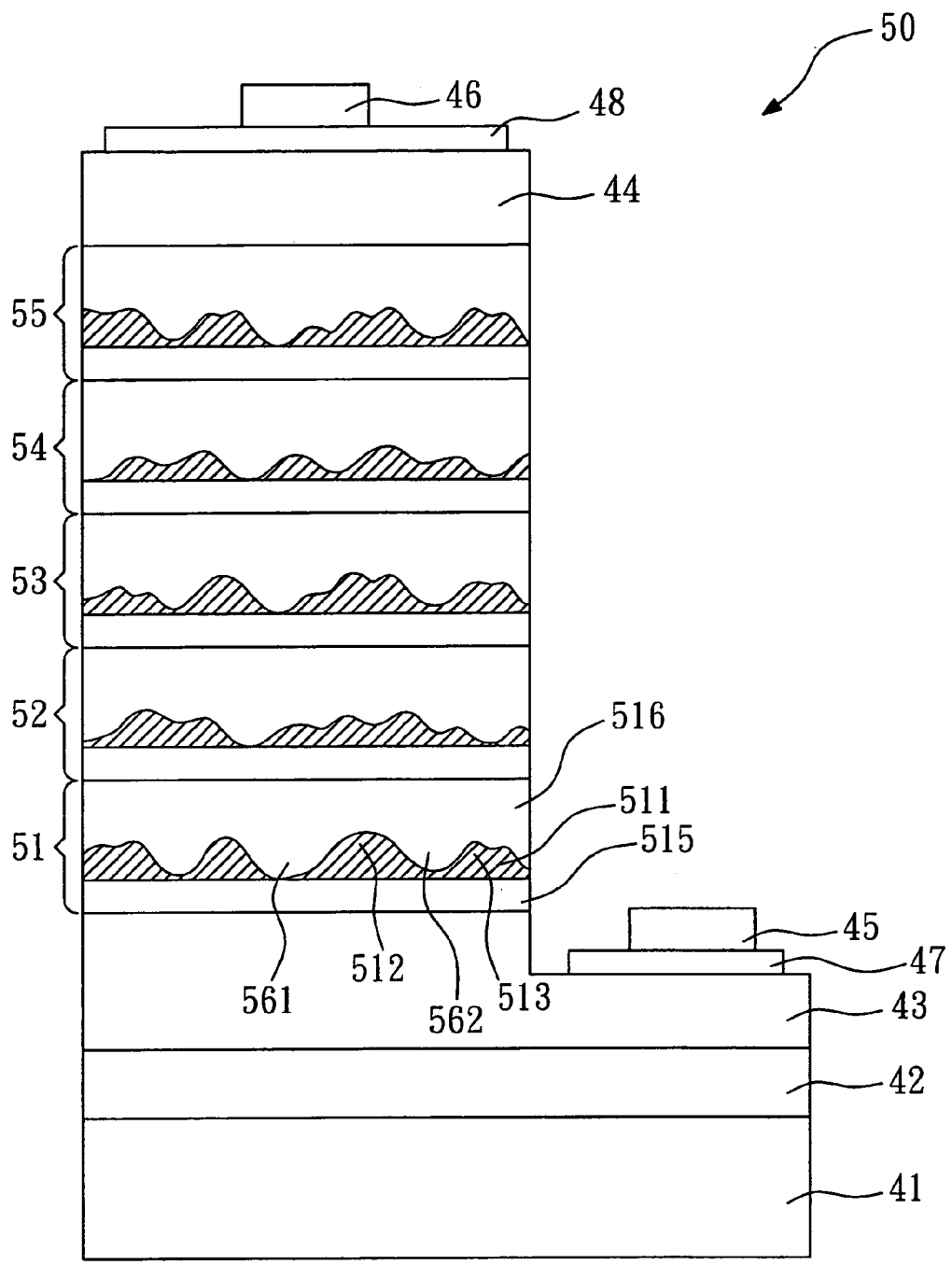
FIG. 4 is a schematic view of the structure of a light-emitting element according to a first embodiment of the invention.

With reference to FIG. 4, it shows the construction of a light-emitting element 50 having porous light-emitting layers according to the first embodiment of the present invention. The light-emitting element 50 includes a substrate 41, a buffer layer 42, a first conductive cladding layer 43, five porous light-emitting layers 51, 52, 53, 54 and 55, and a second conductive cladding layer 44.

The light-emitting 50 further includes two electrodes 45, 46 to be connected with the external power supply, wherein the preferred implemented material is aurum (Au). The buffer layer 42 is formed on the substrate 41. The first conductive cladding layer 43 formed on the buffer layer 42 may be an N-type cladding layer to provide electron. The second conductive cladding layer 44 that is formed on the porous light-emitting layers 55 may be a P-type cladding layer to provide holes. The first conductive cladding layer 43 and the second conductive cladding layer 44 are both of aluminum indium gallium nitride structure, which can be represented as $Al_{(1-x-y)}In_yGa_xN$, and the buffer layer 42 is a nitride structure. It is preferred that a low temperature gallium nitride nucleated layer is first grown on the sapphire substrate 41, then a high temperature silicon nitride layer is grown on the low temperature gallium nitride nucleated layer, and a high temperature gallium nitride layer is grown on this silicon nitride layer, so as to constitute a buffer layer 42 together.

The first conductive electrode contact layer 47 is between the first conductive cladding layer 43 and the electrode 45. In the preferred embodiment, a chromium (Cr) metal layer is evaporated on the N-type conductive gallium nitride cladding layer 43 as the ohm contact layer of the electrode 45 and the N-type conductive gallium nitride layer 43. The second conductive electrode contact layer 48 is between the second conductive cladding layer 44 and the electrode 46. In the preferred embodiment, an ITO transparent conductive layer is evaporated directly on the P-type conductive gallium nitride cladding layer 44 as the ohm contact layer of the electrode 46 and the P-type conductive gallium nitride layer 44.

Five porous light-emitting layers 51, 52, 53, 54, and 55 are sequentially formed above the first conductive cladding layer 43. Taking the porous light-emitting layer 51 as an example, said porous light-emitting layer 51 has a carrier trap layer 511, a lower barrier layer 515, and an upper barrier layer 516. The carrier trap layer 511 has a plurality of chevron structures 512, 513, etc. The lower barrier layer 515 is located below the chevron structures 512, 513, etc.; and the upper barrier layer 516 is located above the chevron structures 512, 513, etc., and covers the chevron structures 512, 513, etc. The lower barrier layer 515 and the upper barrier layer 516 are both of aluminum indium gallium nitride structure that can be represented as $Al_{(1-x-y)}In_yGa_xN$, wherein x is more than zero; y is no less than zero; and (1-x-y) is no less than zero. Furthermore, both of the energy band gaps of the lower barrier layer 515 and the upper barrier layer 516 must be greater than that of the chevron structures 512, 513, etc.

The carrier trap layer 511 is an aluminum indium gallium nitride structure that can be represented as $Al_{(1-x-y)}In_yGa_xN$, wherein x is no less than zero; y is more than zero; and (1-x-y) is no less than zero. A plurality of valley shaped structures 561, 562, etc. are defined between the chevron structures 512, 513, etc. Finally, the valley shaped structures 561, 562 are covered and filled by the upper barrier layer 516. The valley shaped structures 561, 562 must accord with the dimensional limitation of the above FIG. 2 and FIG. 3, and the density of the porous light-emitting layers 51, 52, 53, 54, 55 is preferable between 5% and 75%.

The porous light-emitting layer 51 is doped with a pre-determined concentration of impurity. In a preferred embodiment, the porous light-emitting layer 51 is actively doped with the silicon (Si) impurity, with the number of the doped silicon atoms of the porous light-emitting layer 51 being less than $5 \times 10^{17}/cm^3$. In a more preferred embodiment, when the porous light-emitting layer 51 is growing, it will not be doped with the silicon (Si) atom actively.

By using the structure of the light-emitting element according to the first embodiment of the present invention, the driving voltage of the element may be decreased significantly, thus the structure of the light-emitting element may be employed to decrease the doping concentration in the light-emitting layer without affecting the driving voltage, thereby achieving a preferred crystalline structure and improving the antistatic ability and element reliability.

Figure 5:
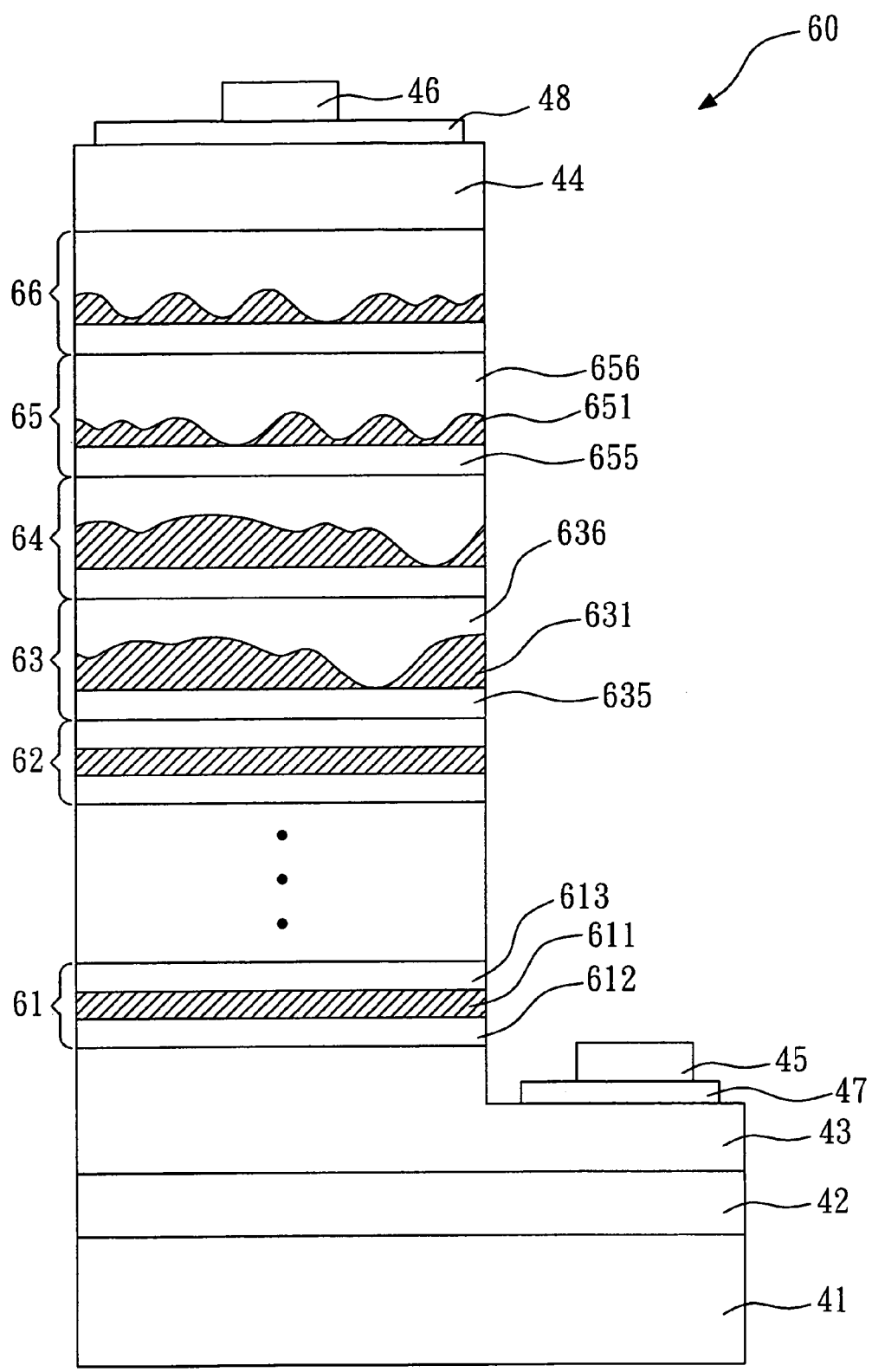
FIG. 5 is a schematic view of the structure of a light-emitting element according to a second embodiment of the invention.

With reference to FIG. 5, it shows a light-emitting element 60 having porous light-emitting layers according to the second embodiment of the present invention. In the FIG. 5, the same parts as the structure of the first embodiment will be designated the same element symbols, and if without particular mention, they have the same constructions and functions.

As shown in FIG. 5, the light-emitting element 60 according to the second embodiment of the present invention is positioned between the N-type conductive cladding layer 43 and P-type conductive cladding layer 44, and includes five quantum well light-emitting layers doped with the silicon (Si) impurity 61, 62, etc., two porous light-emitting layers with a first wavelength 63, 64, etc., and two porous light-emitting layers with a second wavelength 65, 66.

The five quantum well light-emitting layers doped with the silicon (Si) impurity 61, 62, etc. are sequentially formed above the N-type conductive cladding layer 43. Taking the quantum well light-emitting layer 61 as an example, said quantum well light-emitting layer 61 has a quantum well structure 611 and two barrier layers 612 and 613.

Above the quantum well light-emitting layer doped with the silicon (Si) impurity 62 are sequentially the two porous light-emitting layers with the fist wavelength 63, 64. Taking the porous light-emitting layer with the first wavelength 63 as an example, it has a carrier trap layer 631, a lower barrier layer 635, and an upper barrier layer 636. The porous light-emitting layers with the first wavelength 63, 64 are applied to provide a first wavelength, which is 570 nm in the present embodiment.

The two porous light-emitting layers with the second wavelength 65, 66 are sequentially above the porous light-emitting layer with the first wavelength 64. Taking the porous light-emitting layer with the second wavelength 65 as an example, it has a carrier trap layer 651, a lower barrier layer 655, and an upper barrier layer 656. The porous light-emitting layers with the second wavelength 65, 66 are applied to provide a second wavelength, which is 467 nm in the present embodiment. The second wavelength is different from the first wavelength.

The porous light-emitting layers 63, 64, 65, 66 are doped with a predetermined concentration of impurity. In a preferred embodiment, the porous light-emitting layers are doped with the silicon (Si) impurity actively, with the number of the doped silicon atoms of the porous light-emitting layers being less than $5 \times 10^{17}/cm^3$. In a more preferred implementation, when the porous light-emitting layers are growing, they will not be doped with the silicon (Si) atom actively. Also, the structures of the porous light-emitting layers 63, 64, 65, 66 are described in FIG. 2 and FIG. 3, and therefore will not be described here in detail.

In the prior art, it is usually necessary for a light-emitting layer to have a high indium content in order to make the light-emitting wavelength of the light-emitting layer longer. In the conventional art, however, the light-emitting efficiency of the light-emitting layer with the high indium content is inefficient. In the embodiments of the present invention, although the light-emitting layer with the longer light-emitting wavelength is the layer with high indium content, it still has excellent high light-emitting efficiency.

Figure 6:
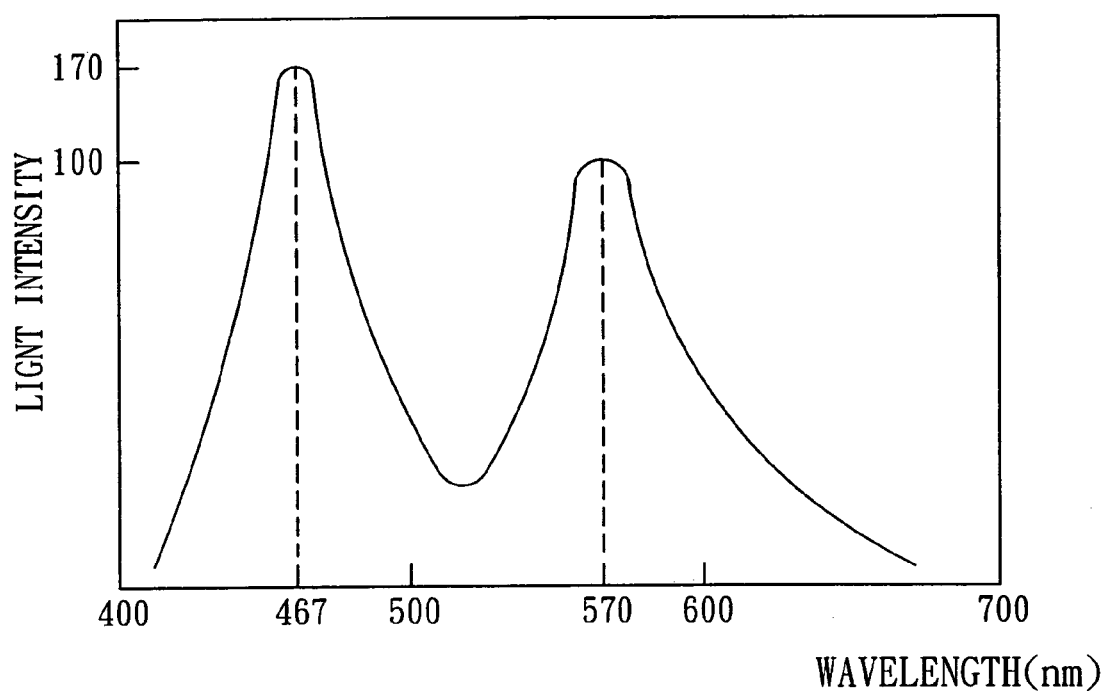
FIG. 6 is a diagram for the light intensity and the frequency spectrum distribution of the light-emitting element according to a second embodiment of the invention.

With reference to FIG. 6, the porous light-emitting layers with the first wavelength 63, 64 are applied to provide a first wavelength of 570 nm, and can be controlled to have a maximum light intensity of 100. The porous light-emitting layers with the second wavelength 65, 66 are applied to provide a second wavelength of 467 nm, and can be controlled to have a maximum light intensity of 170. In this embodiment, the density of the porous light-emitting layers with the first wavelength 63, 64 is 7%, and the density of the porous light-emitting layers with the second wavelength 65, 66 is 25%, in order to achieve the above maximum light intensities of 100 and 170, respectively.

If the density of the porous light-emitting layers with the first wavelength 63, 64 is fixed to 7%, and the density of the porous light-emitting layers with the second wavelength 65, 66 is adjusted to 5%, it will have a ratio of 1/5 of the maximum light intensity of the first wavelength to that of the second wavelength (i.e., the light intensity of the second wavelength is as 5 times as that of the first wavelength). If the density of the porous light-emitting layers with the second wavelength 65, 66 is adjusted to 43%, it will have the maximum light intensities of 100 and 120, respectively. Therefore, the maximum light intensities and the light-mixing ratio of the first wavelength and the second wavelength can be adjusted by adjusting the density of the porous light-emitting layers with the second wavelength 65, 66. The light-emitting element of the present invention can thus be applied to provide a variety of colors of light sources, such as pink, pinkish blue, pinkish yellow, pinkish green, various colors of warm white light and the like.

The difference between the light-emitting element structure having porous light-emitting layers of the present invention and the conventional quantum well light-emitting layer is that the indium-containing compound semiconductor material with a lower energy band gap is further grown and shaped into an indium-containing compound semiconductor structure with a porous structure. In other words, on a single plane of such indium-containing compound semiconductor with the lower energy band gap, there will be a plurality of valley shaped structures, which will be in turn covered by a layer of barrier material with a higher energy band gap, and whose diameter dimension and depth may be regulated in application, and which can even extend throughout the indium-containing compound semiconductor layer directly. The driving voltage and electric leakage characteristic of the element can be decreased significantly by growing the porous light-emitting layer structure. In addition, when the multiple porous light-emitting layers with different wavelengths are grown, the electron-hole recombination may occur inside the light-emitting layers with different energy band gaps.

Accordingly, the porous light-emitting layer of the present invention can not only improve the performance of the light-emitting element efficiently, but also achieve a light mixing element of a single chip, with the features of high light-emitting efficiency, high reliability, high light mixing modularity, and low cost and so on. Also, the porous light-emitting layer structure of the present invention can overcome the disadvantage that the light-emitting element in the conventional art can only emit a single wavelength. The light-emitting element of the present invention can achieve the combination of the light-emitting layers with different light-emitting frequency spectrums to produce an efficient element with a high flexible light mixing ratio.

Figure 7:
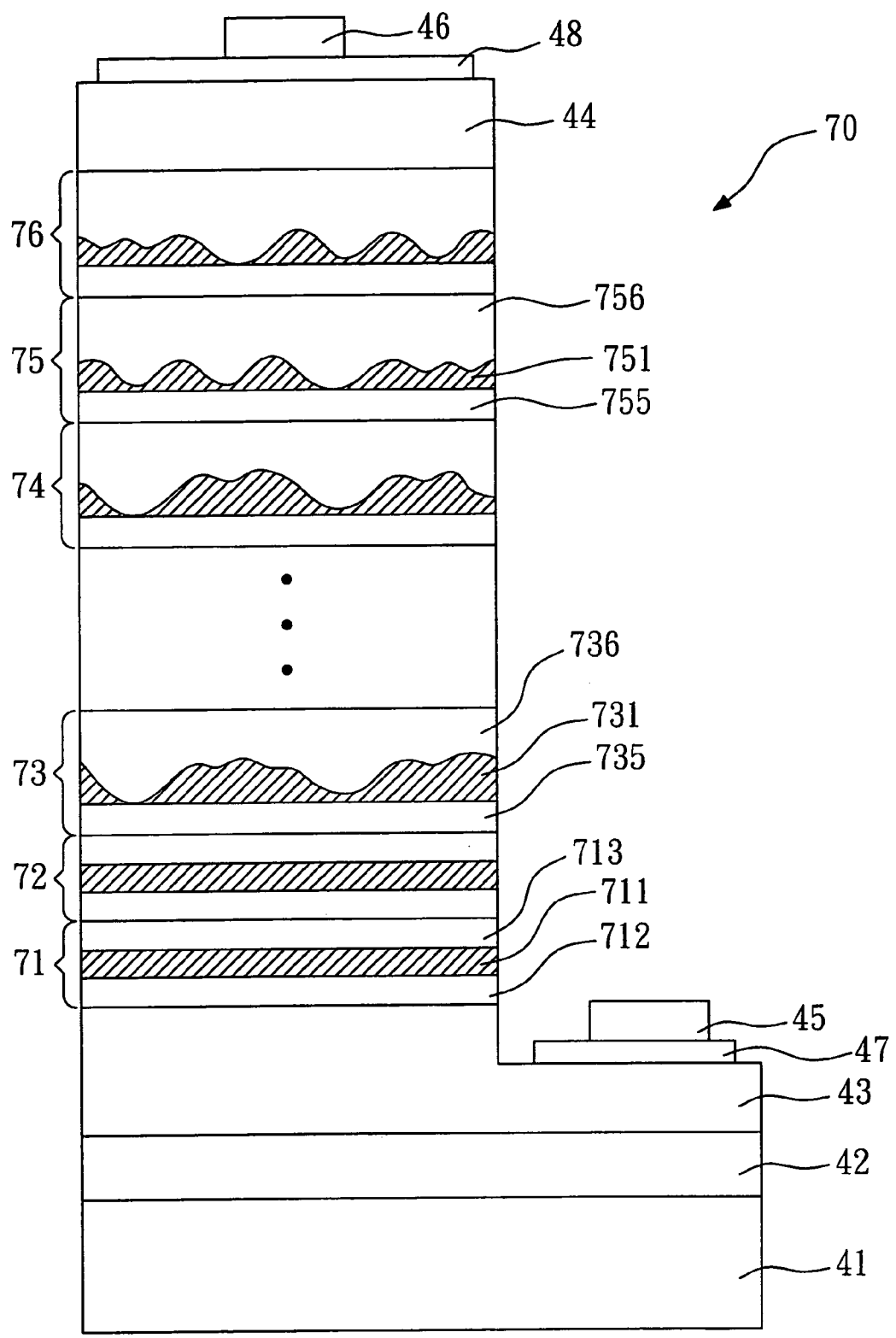
FIG. 7 is a schematic view of the structure of a light-emitting element according to the third embodiment of the invention.

As shown in FIG. 7, a light-emitting element 70 according to the third embodiment of the present invention is positioned between the N-type conductive cladding layer 43 and P-type conductive cladding layer 44, and includes two quantum well light-emitting layers doped with the silicon (Si) impurity 71, 72, five porous light-emitting layers with a first wavelength 73, 74, etc., and two porous light-emitting layers with a second wavelength 75, 76.

Two quantum well light-emitting layers doped with the silicon (Si) impurity 71, 72, etc. are sequentially formed above the N-type conductive cladding layer 43. Taking the quantum well light-emitting layer 71 as an example, said quantum well light-emitting layer 71 has a quantum well structure 711 and two barrier layers 712, and 713.

The five porous light-emitting layers with the first wavelength 73, 74 are sequentially above the quantum well light-emitting layer doped with the silicon (Si) impurity 72. Taking the porous light-emitting layer with the first wavelength 73 as an example, it has a carrier trap layer 731, a lower barrier layer 735, and an upper barrier layer 736. The porous light-emitting layers with the first wavelength 73, 74 are applied to provide a first wavelength, which is 565 nm in the present embodiment.

The two porous light-emitting layers with the second wavelength 75, 76 are sequentially above the porous light-emitting layer with the first wavelength 74. Taking the porous light-emitting layer with the second wavelength 75 as an example, it has a carrier trap layer 751, a lower barrier layer 755, and an upper barrier layer 756. The porous light-emitting layers with the second wavelength 75, 76 are applied to provide a second wavelength, which is 465 nm in the present embodiment. The second wavelength is different from the first wavelength.

The porous light-emitting layers 73, 74, 75, 76 are doped with a predetermined concentration of impurity. In a preferred embodiment, the porous light-emitting layers are doped with the silicon (Si) impurity actively, with the number of the doped silicon atoms of the porous light-emitting layers being less than $5 \times 10^{17}/cm^3$. In a more preferred implementation, when the porous light-emitting layers are being grown, they are not doped with the silicon (Si) atom actively. Also, the structures of the porous light-emitting layers 73, 74, 75, 76 are described in FIG. 2 and FIG. 3, and therefore will not be described here in detail.

Figure 8:
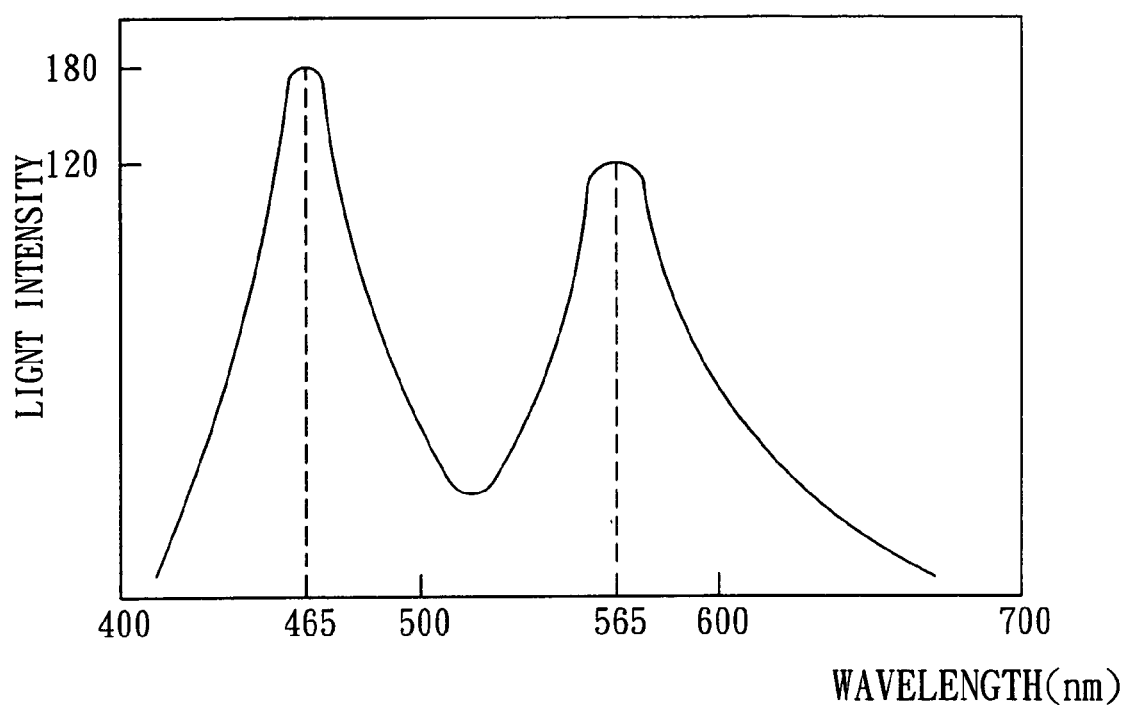
FIG. 8 is a diagram for the light intensity and the frequency spectrum distribution of the light-emitting element according to the third embodiment of the invention.

With reference to FIG. 8, the porous light-emitting layers with the first wavelength 73, 74 are applied to provide a first wavelength of 565 nm, and can be controlled to have a maximum light intensity of 120. The porous light-emitting layers with the second wavelength 75, 76 are applied to provide a second wavelength of 465 nm, and can be controlled to have a maximum light intensity of 180. In this embodiment, the density of the porous light-emitting layers with the first wavelength 73, 74 is 5%, and the density of the porous light-emitting layers with the second wavelength 75, 76 is 28%, in order to achieve the above maximum light intensities of 120 and 180, respectively.

If the density of the porous light-emitting layers with the second wavelength 73, 74 is fixed to 28%, and the density of the porous light-emitting layers with the first wavelength 73, 74 is adjusted to 43%, it will have a ratio of 3 of the maximum light intensity of the first wavelength to that of the second wavelength (i.e., the light intensity of the first wavelength is 3 times that of the second wavelength). Therefore, the maximum light intensities and the light mixing ratio of the first wavelength and the second wavelength can be adjusted by adjusting the density of the porous light-emitting layers with the first wavelength 73, 74.

Figure 9:
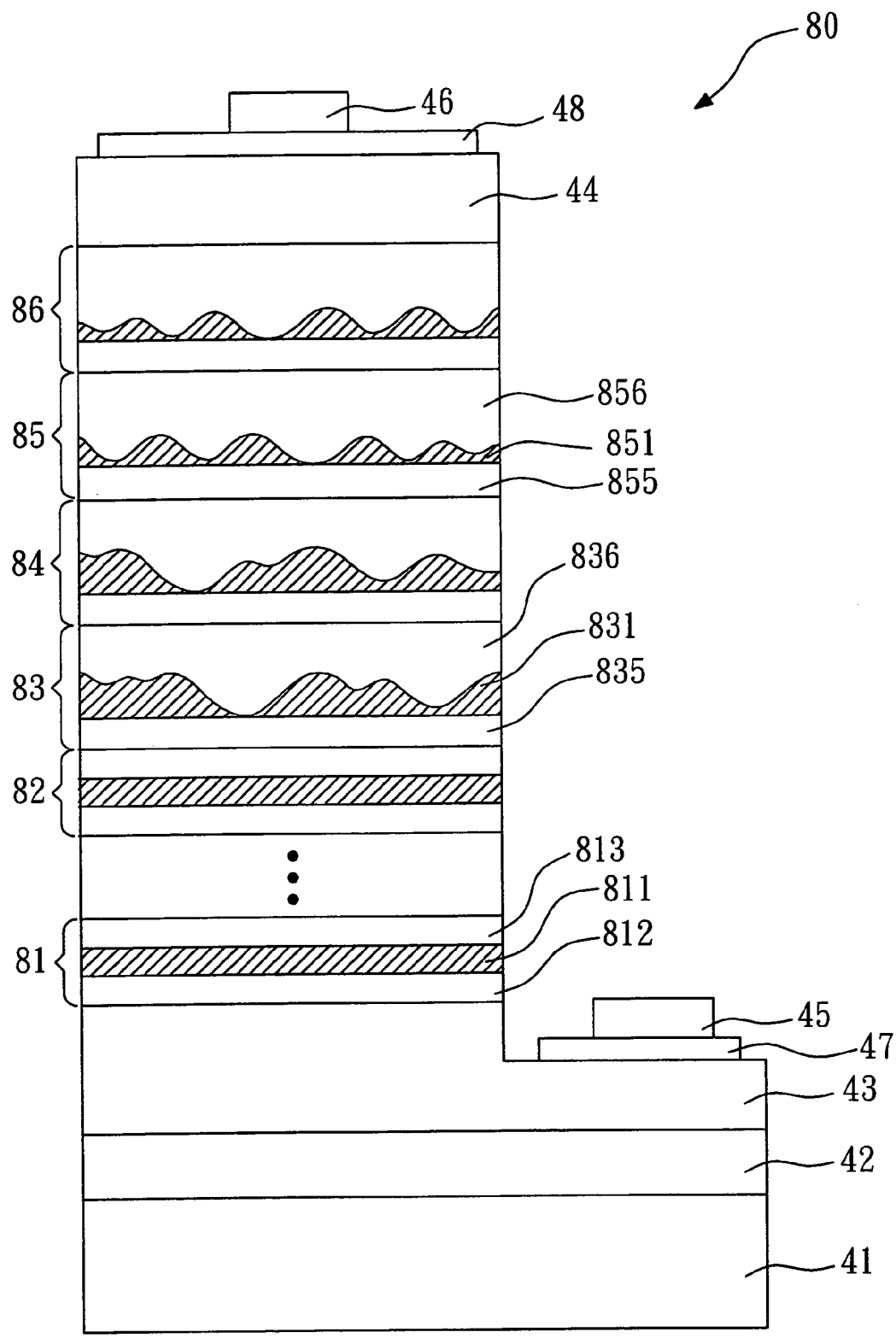
FIG. 9 is a schematic view of the structure of a light-emitting element according to the fourth embodiment of the invention.

As shown in FIG. 9, a light-emitting element 80 according to the fourth embodiment of the present invention is positioned between the N-type conductive cladding layer 43 and P-type conductive cladding layer 44, and includes four quantum well light-emitting layers doped with the silicon (Si) impurity 81, 82, two porous light-emitting layers with a first wavelength 83, 84, etc., and two porous light-emitting layers with a second wavelength 85, 86.

Two quantum well light-emitting layers doped with the silicon (Si) impurity 81, 82 are sequentially formed above the N-type conductive cladding layer 43. Taking the quantum well light-emitting layer 81 as an example, said quantum well light-emitting layer 81 has a quantum well structure 811 and two barrier layers 812, and 813.

Two porous light-emitting layers with the first wavelength 83, 84 are sequentially above the quantum well light-emitting layer doped with the silicon (Si) impurity 82. Taking the porous light-emitting layer with the first wavelength 83 as an example, it has a carrier trap layer 831, a lower barrier layer 835, and an upper barrier layer 836. The porous light-emitting layers with the first wavelength 83, 84 are applied to provide a first wavelength, which is 410 nm in the present embodiment.

The two porous light-emitting layers with the second wavelength 85, 86 are sequentially above the porous light-emitting layer with the first wavelength 84. Taking the porous light-emitting layer with the second wavelength 85 as an example, it has a carrier trap layer 851, a lower barrier layer 855, and an upper barrier layer 856. The porous light-emitting layers with the second wavelength 85, 86 are applied to provide a second wavelength, which is 470 nm in the present embodiment. The second wavelength is different from the first wavelength.

The porous light-emitting layers 83, 84, 85, 86 are doped with a predetermined concentration of impurity. In a preferred embodiment, the porous light-emitting layers are doped with the silicon (Si) impurity actively, with the number of the doped silicon atoms of the porous light-emitting layers being less than $5 \times 10^{17}/cm^3$. In a more preferred implementation, when the porous light-emitting layers are growing, they will not be doped with the silicon (Si) atom actively. Also, the structures of the porous light-emitting layers 83, 84, 85, 86 are described in FIG. 2 and FIG. 3, and therefore will not be described here in detail.

Figure 10:
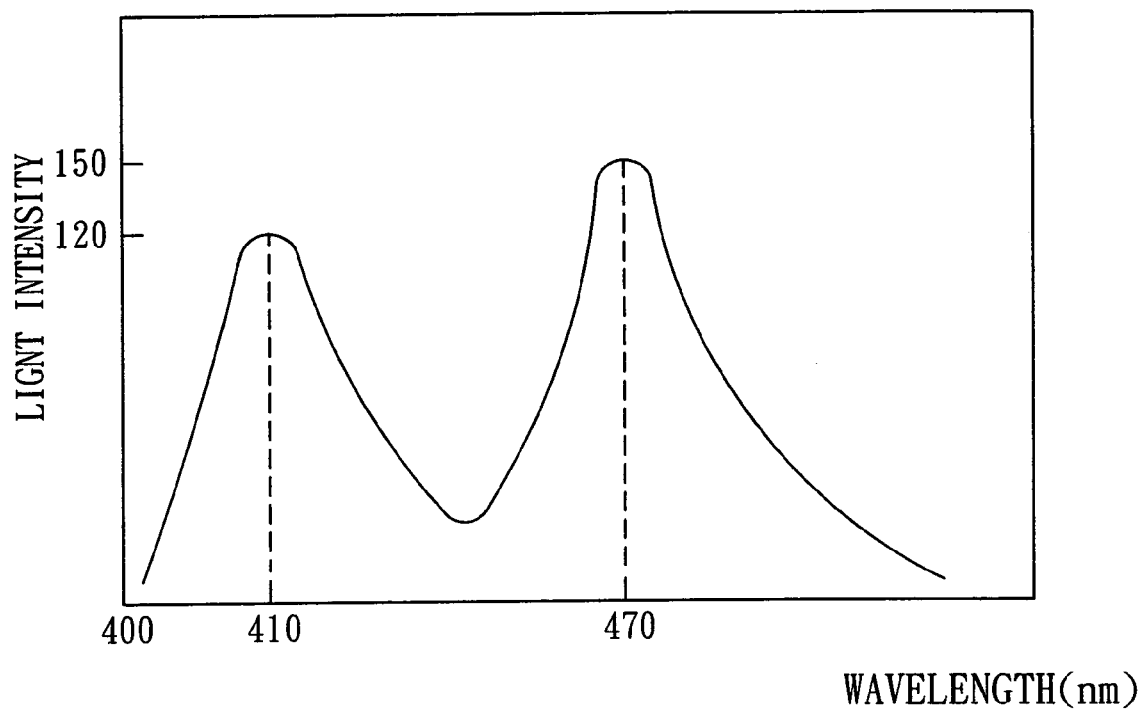
FIG. 10 is a diagram for the light intensity and the frequency spectrum distribution of the light-emitting element according to the fourth embodiment of the invention.

With reference to FIG. 10, the porous light-emitting layers with the first wavelength 83, 84 are applied to provide a first wavelength of 410 nm, and can be controlled to have a maximum light intensity of 120. The porous light-emitting layers with the second wavelength 85, 86 are applied to provide a second wavelength of 470 nm, and can be controlled to have a maximum light intensity of 150. In this embodiment, the density of the porous light-emitting layers with the first wavelength 83, 84 is 15%, and the density of the porous light-emitting layers with the second wavelength 85, 86 is 34%, in order to achieve the above maximum light intensities of 120 and 150, respectively.

Due to the fact that the current methods which employ the blue light with a wavelength of 455-470 nm to excite the white light provided by the yellow green light fluorescent power (such as YAG) cannot achieve a better color-rendering performance because the blue light wavelength capable of exciting the yellow green light yellow fluorescent power cannot be used at the same time to excite, for example, the yellow orange light, red light long wavelength fluorescent power to achieve high efficiency of light transformation, while the preferred light transforming wavelength indicated in the recent research is 370-450 nm, thus the multiple frequency spectrum single chip technique of the present invention can be used to increase the frequency spectrum of another light-emitting wavelength of 410 nm besides the blue light wavelength so as to optimize the transforming efficiency of the fluorescent power.

If the density of the porous light-emitting layers with the first wavelength 83, 84 is fixed to 15%, and the density of the porous light-emitting layers with the second wavelength 85, 86 is adjusted to 7%, the maximum light intensities of the first wavelength and the second wavelength will be 40 and 210, respectively. Thus, the maximum light intensities and the light mixing ratio of the first wavelength and the second wavelength can be adjusted by adjusting the density of the porous light-emitting layers with the second wavelength 85, 86.

The light-emitting elements of the present invention are not limited to the porous light-emitting layers with the first wavelength and the porous light-emitting layer with the second wavelength described above, and may further include a plurality of porous light-emitting layers formed between the N-type conductive cladding layer and the P-type conductive cladding layer. The porous light-emitting layers have a plurality of light-emitting wavelengths, which are different from the first wavelength and the second wavelength, to achieve the combination of light-emitting layers with different light-emitting frequency spectrums to produce an efficient element with a high flexible light mixing ratio.

The embodiments described above should be regarded to illustrate the principle and the performance of the present invention merely, rather than limiting the scope of the present invention. Therefore, modifications and variations can be made thereto by those skilled in the art without departing from the spirit of the present invention. The scope of the present invention should be as defined in the following claims.

What is claimed is:

1. A light-emitting element with porous light-emitting layers, comprising:
    a substrate;
    a first conductive cladding layer;
    a second conductive cladding layer; and
    at least one porous light-emitting layer formed between the first conductive cladding layer and the second conductive cladding layer, the porous light-emitting layer having an upper barrier layer, a lower barrier layer and a carrier trap layer, the carrier trap layer positioned between the upper barrier layer and the lower barrier layer, the carrier trap layer having a plurality of chevron structures for defining a plurality of valley shaped structures, the carrier trap layer being an indium-containing nitride structure, the energy band gap of the carrier trap layer being less than that of the upper barrier layer and the lower barrier layer.

2. The light-emitting element according to claim 1, wherein the carrier trap layer is an aluminum indium gallium nitride structure that may be represented as $Al_{(1-x-y)}In_yGa_xN$, in which, x is no less than zero; y is more than zero; and (1-x-y) is no less than zero.

3. The light-emitting element according to claim 1, wherein the lower barrier layer and the upper barrier layer are both of aluminum indium gallium nitride structure that may be represented as $Al_{(1-x-y)}In_yGa_xN$, in which, x is more than zero; y is no less than zero; and (1-x-y) is no less than zero.

4. The light-emitting element according to claim 1, wherein the porous light-emitting layer is doped with a predetermined concentration of impurity, the content of which is between zero and $5\times10^{17}/cm^3$.

5. The light-emitting element according to claim 1, wherein the distance between the bottom of each of the valley-shaped structures and the lower barrier layer is in the range of no less than zero to no more than $20\times10^{-10}$ meters, and the radial length of each of the valley-shaped structures is between $5\times10^{-9}$ and $1000\times10^{-9}$ meters.

6. The light-emitting element according to claim 5, wherein the density of the porous light-emitting layer is between 5% and 75%, which is the ratio of the sum of the radial length of all valley shaped structures to the radial length of the porous light-emitting layer.

7. A light-emitting element with porous light-emitting layers, including:
    a substrate;
    an N-type conductive cladding layer;
    a P-type conductive cladding layer; and
    at least one porous light-emitting layer with a first wavelength and at least one light-emitting layer with a second wavelength, formed between the N-type conductive cladding layer and the P-type conductive cladding layer, the porous light-emitting layer with the first wavelength being adjacent to the P-type conductive cladding layer, the first wavelength being different from the second wavelength, the porous light-emitting layer with the first wavelength having an upper barrier layer, a lower barrier layer and a carrier trap layer; the carrier trap layer positioned between the upper barrier layer and the lower barrier layer, and the carrier trap layer having a plurality of chevron structures for defining a plurality of valley shaped structures; the carrier trap layer being an indium-containing nitride structure, the energy band gap of the carrier trap layer being less than that of the upper barrier layer and the lower barrier layer.

8. The light-emitting element according to claim 7, which further includes a plurality of porous light-emitting layers formed between the N-type conductive cladding layer and the P-type conductive cladding layer, wherein the porous light-emitting layers have a plurality of light-emitting wavelengths, which are different from the first wavelength and the second wavelength.

9. The light-emitting element according to claim 7, wherein the carrier trap layer is an aluminum indium gallium nitride structure that may be represented as $Al_{(1-x-y)}In_yGa_xN$, in which, x is no less than zero; y is more than zero; and (1-x-y) is no less than zero.

10. The light-emitting element according to claim 7, wherein the lower barrier layer and the upper barrier layer are both an aluminum indium gallium nitride structure that may be represented as $Al_{(1-x-y)}In_yGa_xN$, in which, x is more than zero; y is no less than zero; and (1-x-y) is no less than zero.

11. The light-emitting element according to claim 7, wherein the porous light-emitting layers are doped with a predetermined concentration of impurity, the content of which is between 0 and $5 \times 10^{17}/cm^3$.

12. The light-emitting element according to claim 7, wherein the distance between the bottom of each of the valley shaped structures and the lower barrier layer is in the range of no less than zero to no more than $20 \times 10^{-9}$ meters, and the radial length of each of the valley shaped structures is between $5 \times 10^{-9}$ and $1000 \times 10^{-9}$ meters.

13. The light-emitting element according to claim 12, wherein the density of the porous light-emitting layers is between 5% and 75%, which is the ratio of the sum of the radial length of all valley shaped structures to the radial length of the porous light-emitting layer.

14. The light-emitting element according to claim 13, wherein the light-emitting layer with the second wavelength is a porous light-emitting layer with the second wavelength.

15. The light-emitting element according to claim 14, wherein the porous light-emitting layer with the first wavelength has a first density, and the porous light-emitting layer with the second wavelength has a second density, the first density is larger than the second density.

16. The light-emitting element according to claim 14, wherein the first wavelength is smaller than the second wavelength.

* * * * *